United States Patent [19]
Robinson

[11] Patent Number: 5,142,157
[45] Date of Patent: Aug. 25, 1992

[54] HIGH DENSITY MODULAR POWER SWITCH DRIVERS

[75] Inventor: Lewis E. Robinson, Dallas, Tex.

[73] Assignee: Texas Instruments Incorporated, Dallas, Tex.

[21] Appl. No.: 669,172

[22] Filed: Mar. 14, 1991

[51] Int. Cl.⁵ ............................................. G02B 27/00
[52] U.S. Cl. ................................................. 250/551
[58] Field of Search ................ 250/551; 455/602, 606, 455/607

[56] References Cited

U.S. PATENT DOCUMENTS

| | | | |
|---|---|---|---|
| 4,393,515 | 7/1983 | de Neumann | 250/551 |
| 4,437,190 | 3/1984 | Rozenwaig et al. | 250/551 |
| 4,446,375 | 5/1984 | Aird | 250/551 |
| 4,612,670 | 9/1986 | Henderson | 250/551 |
| 4,633,582 | 1/1987 | Ching et al. | 250/551 |
| 4,695,120 | 9/1987 | Holder | 250/551 |
| 5,010,450 | 4/1991 | Werdin et al. | 250/551 |

Primary Examiner—Janice A. Howell
Assistant Examiner—Kiet T. Nguyen
Attorney, Agent, or Firm—B. Peter Barndt; Richard L. Donaldson

[57] ABSTRACT

A plurality of power driver modules are removably mounted on a circuit board which interfaces with a computer control system. The input/power driver output switches in each module use optical coupling. A controller sets the power switches according to instructions from the computer control system, and the system can determine the set state of the power switches by reading a set state memory or directly determining the actual state of the switches by reading the switch state from an input circuit on the input/output power driver module.

17 Claims, 4 Drawing Sheets

HIGH DENSITY MODULAR POWER SWITCH DRIVERS

FIELD OF THE INVENTION

This invention relates to power drivers for control circuits, and more particularly a circuit board configuration for configuring a large number of discrete optically coupled Input/Power output bit drivers in a small volume.

BACKGROUND OF THE INVENTION

Existing high density bit drivers omit optical couplers or power drivers, or alternatively, provide a small number of I/0 bits. Existing products do not use a modular approach to the I/0 function, and use a single monolithic printed circuit board on which all components are mounted.

Present day I/O bit driver circuit boards require large areas and are not of a small size required in the new equipment design. A number of driver circuit boards are required to provide the I/O capability of the present invention. Repair of presently existing board are difficult to repair, and may require down time for equipment during the board repair.

BRIEF SUMMARY OF THE INVENTION

The invention is a circuit and circuit board design that provides optically coupled input/driver output circuits on a single circuit board, utilizing a plurality of low cost plug-in I/O drivers modules. The set values of the outputs of the module can be determined either by reading memory bytes on the module to determine the last set of values, or the input can be read to determine the actual value of the outputs. This dual output read capability provides a measure of dynamic self check of an I/O's proper operation.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT

Figure 1:
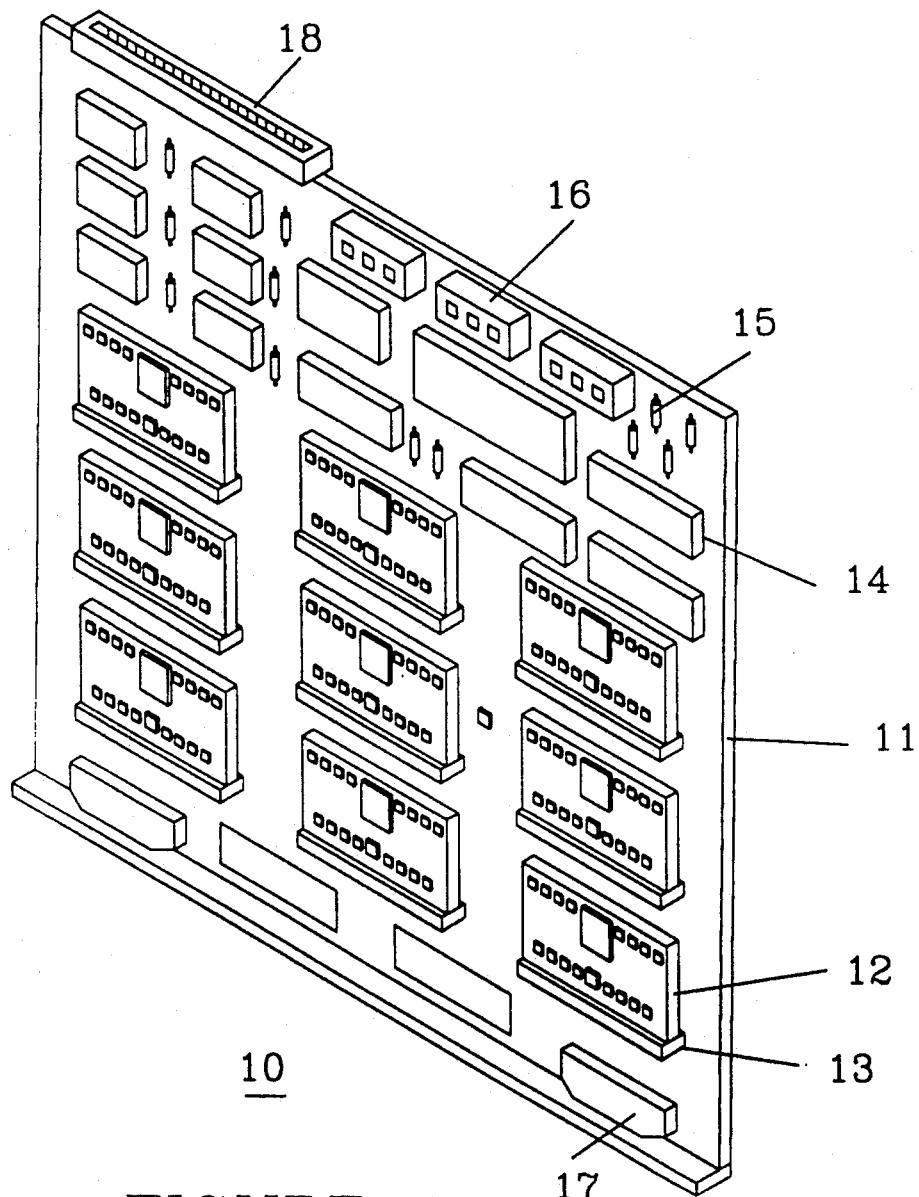
FIG. 1 is an isometric view of the circuit board having plug-in I/O modules.

FIG. 1 is an isometric view of an input/power driver output circuit board with a plurality of low cost plug-in I/O drivers modules. Circuit board 10 has a printed circuit board 11 with a plurality of plug-in I/O modules 12. Each module 12 plugs in a socket 13, which, in one embodiment, slants the module to provide a low profile for the circuit board and plug-in modules. A plurality of logic circuits 14 on the circuit board provide the interfacing of the I/O modules 12 with a bus that is connected to a System Computer through bus connector 18. Board 10 has one or more cable-plug interfaces 17 through which communications with circuit board 10 and machine interface is established. Other components such as resistors 15 and switches 16 may be on circuit board 10, depending upon the exact circuit configuration. Circuit board 10 also includes a state controller and an interface to each of the modules 12.

Figure 2:
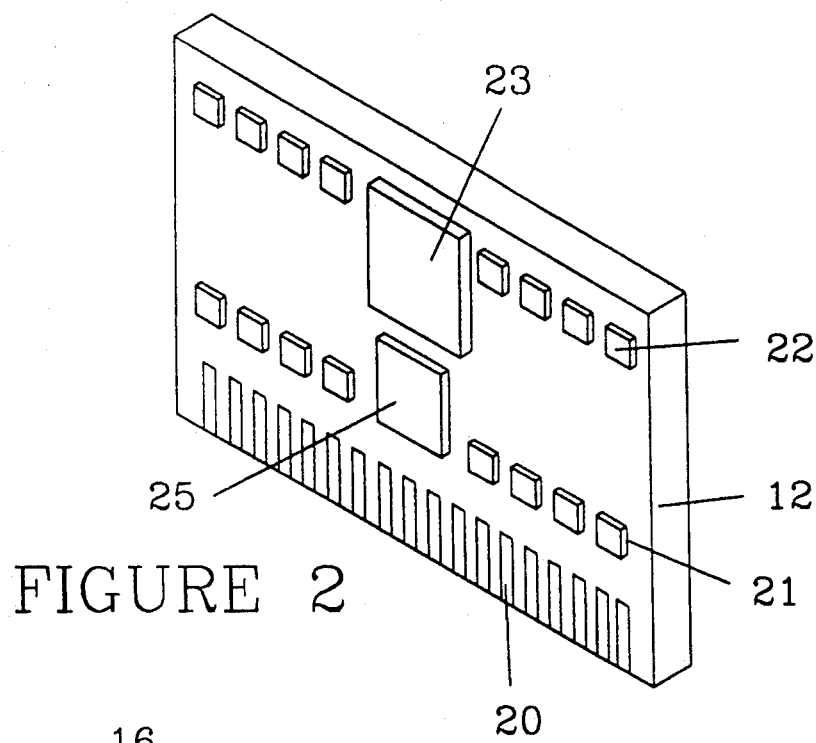
FIG. 2 is an enlarged view of a module of FIG. 1.

FIG. 2 illustrates one of the I/O modules 12. Module 12 has contacts 20 which interconnect the circuitry on module 12 to the circuit board 11 through the connectors 13. Optical couplers 21 interface between the latch 23 and the driver devices 22 to the contacts 20. Optical couplers also interface between contacts 20 and the input latch 25.

The components shown on module 12 are for purposes of illustration. Different component lay-outs may be used in practice.

Opto couplers are used to isolate the power switch drivers from the controller device, and to avoid a large current loop. Through the use of a plug in module for the I/o drivers, each module may be replaced without a lengthy down time for repair.

Figure 3:
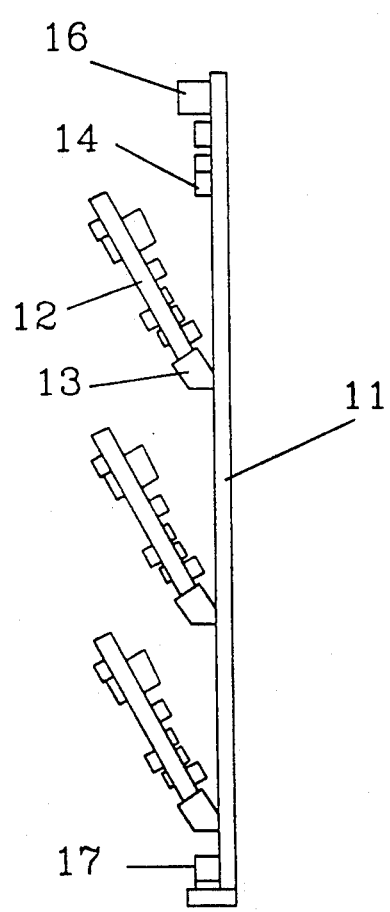
FIG. 3 is a side view of the circuit board of FIG. 1.

FIG. 3 is a side view of circuit board 10 showing the angled mounting of the I/O modules 12. Each module is in a connector 13 which angles the module above the surface of circuit board 11. By placing the modules at a low angle, the overall height of the I/O driver board 10 has a low profile permitting a higher density of circuit boards in a limited volume. Circuit components may be mounted on circuit board 11 under the angled modules as long as there is no contact between the modules and the components.

Figure 4:
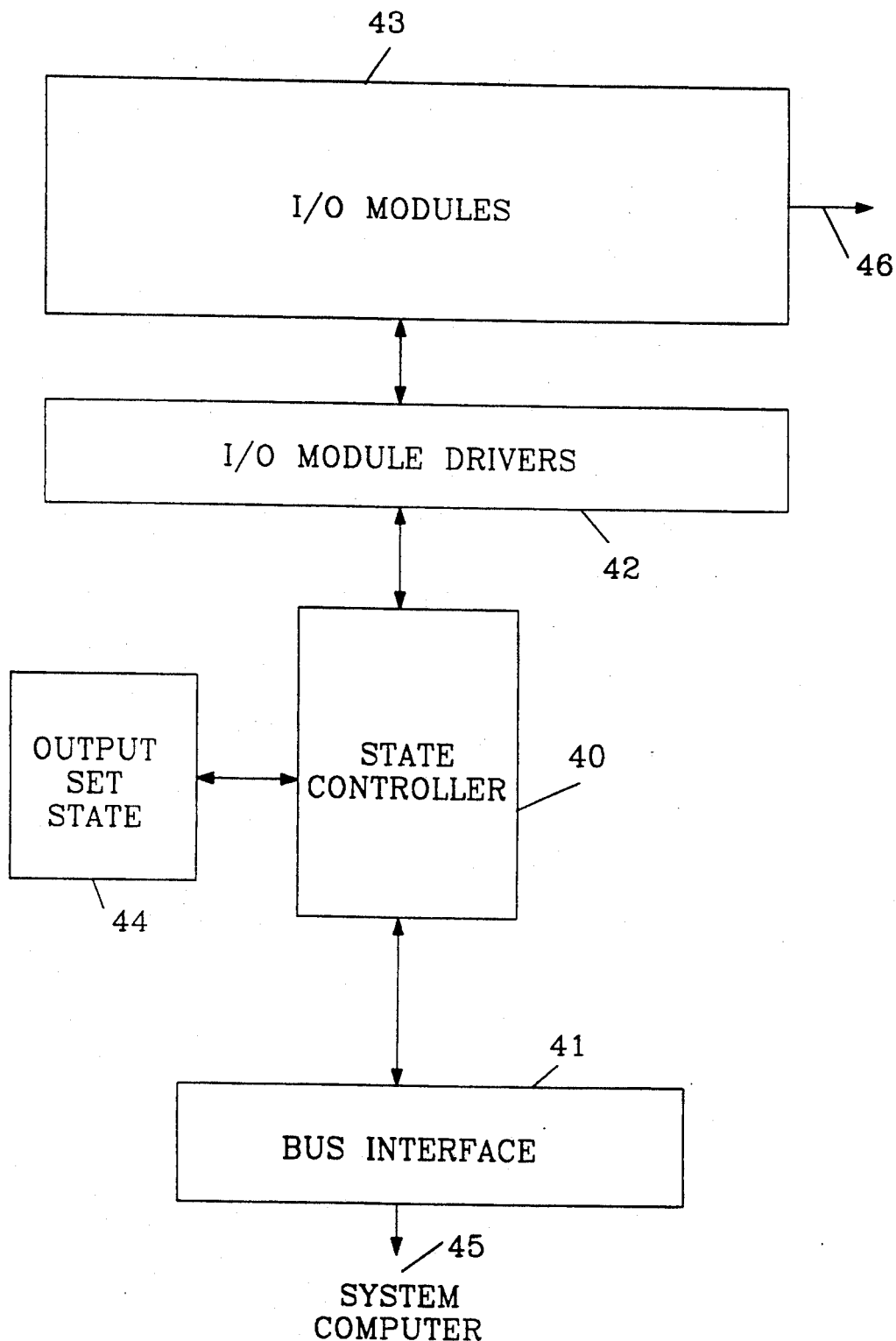
FIG. 4 is a block diagram of the circuit and plug-in modules of FIG. 1.

FIG. 4 is a functional diagram of circuit board 10, and the circuit functions thereon. Each circuit board includes a state controller 40 for receiving data input from a System Computer 45, the software programming of which defines the switching logic of the I/O modules 43. State controller 40 interfaces the System Computer through bus interface 41. Bus interface 41 can interface the state controller to, for example, a personal type computer, a VME bus, or any other compatible bus, depending upon the type of machine controller to be used. In some instances, each machine or group of machines may have a dedicated computer such as a small personal computer. A larger system may be used which is controlling a network of machines and industrial systems.

Each circuit board includes a I/O module Driver interface 42 to interface a plurality of I/O modules 43 to the state controller. FIG. 1 illustrates nine modules, but there may be more or less I/O modules 43 depending upon the number needed in the system.

Each module has an Output Set State 44. This circuit is a memory circuit, in one embodiment, which stores the set state of the Switch/Drivers in modules. 43. At any time, System Computer 45 may interrogate the circuit board to determine how each switch/driver is set, i.e. how each bit for each driver line is set, to a logical "1" or logical "0". This may be used as a feed back to the system to determine if the data to control the switch/drivers is properly set.

Each module 43 has an output to the machine/system that is being controlled. The switch/drivers may be controlling, for example, motors, relays, indicator lights, and any other device that can utilize power stitches for drivers.

Figure 5:
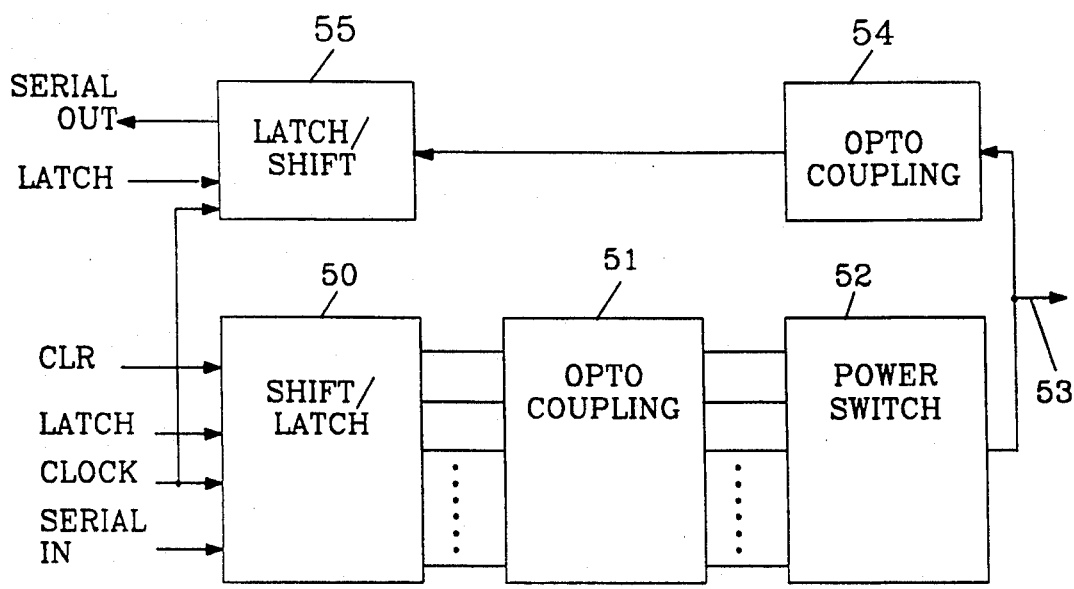
FIG. 5 is a block diagram of a I/O module using a serial input/output.
Figure 6:
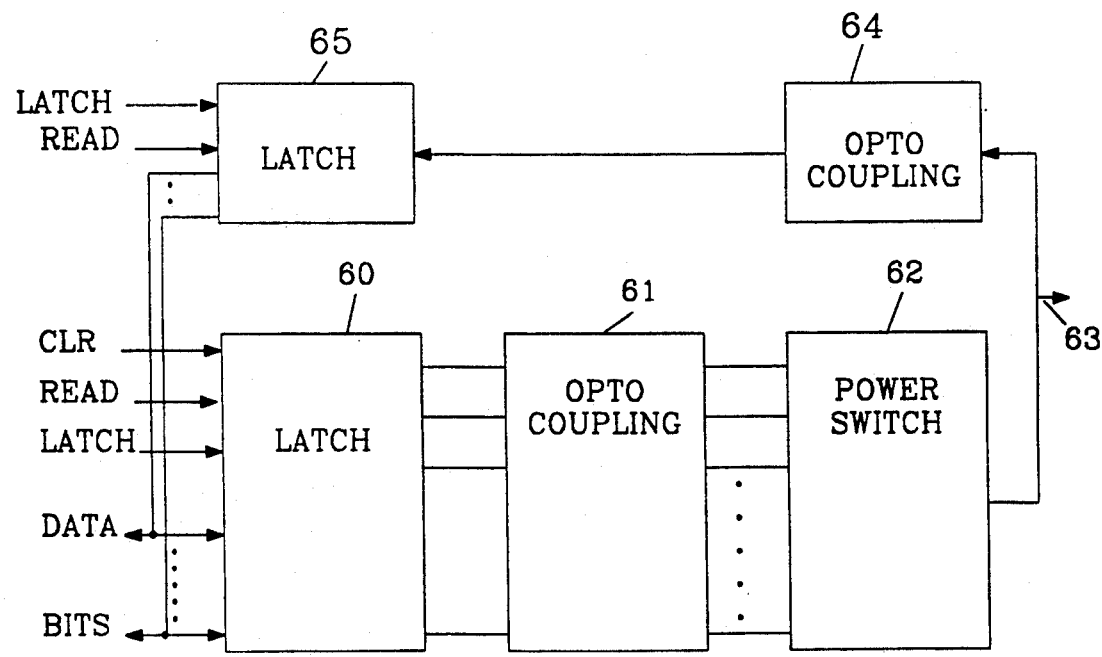
FIG. 6 is a block diagram of an I/O modules having a parallel input/output.

FIGS. 5 and 6 illustrate two different I/O modules. FIG. 5 is an I/O module that uses Serial data. The serial data is clocked in by a clock into a Shift/Latch 50. The data is then optically coupled 51 to the Power Switch 52. The Shift/latch determines the output data lines of the Power Switch 52. Power Switch 52 is connected via driver lines 53 to the device being driven by the Power Switch. Optical coupling is used to prevent having large current loops between the circuit board and the controlled device. The current loop is limited to the circuit between the Power Switch and the controlled device. The Output Set State 44 (FIG. 4) stores the output state configuration of Power Switch 52 so that the System Computer may at any time determine what the output state of Power Switch is supposed to be. Input opto couplers 54 are also connected to driver lines 53 and are able to sense power switch 52 state or equipment provided states. Latch/shift 55 captures the state at opto coupler 54 for serial input back to system computer 45.

FIG. 6 is another embodiment of the I/O module. This embodiment includes the same basic functional blocks as the I/O module of FIG. 5, except that the input to the Latch 60 and output from latch 65 is in parallel form, one input line for each data bit. The System Computer 45 can interrogate Latch 60 on the READ line to determine how the Power Switch 62 has been set and interrogate latch 65 on the READ line to determine how it is actually set. In this embodiment, the Output Set State memory 44, FIG. 4, is not necessary since System Computer 45 can determine how the Power Switch 62 is actually set. Both embodiments, FIGS. 5 and 6, permit System Computer 45 to immediately determine if there is an Error in the switch setting of a Power Switch. Line 63 interfaces Power Switch 62 to the devices being controlled or monitored.

What is claimed:

1. A high density input/output power driver circuit board, comprising:
   a circuit board having interface circuitry;
   a plurality of input/output power driver switch modules mounted on said circuit board and interconnected with said interface circuitry;
   a single state controller for setting the state of each power driver switch module; and
   a bus interface for interfacing said circuit board and said state controller with a computer.

2. The input/output power driver circuit board according to claim 1, wherein said input/output power driver switches are modules removably mounted on said circuit board.

3. The input/output power driver circuit board according to claim 1, including an output set state memory for storing the set state of each power driver switch.

4. The input/output power driver circuit board according to claim 2, wherein the plurality of input/output modules are mounted at a angle to the circuit board to minimize the volume required by the circuit board and mounted modules.

5. The input/output power driver circuit board according to claim 2, wherein each power switch module includes
   an output shift/latch;
   an input latch/shift;
   a plurality of power switches;
   optical couplers coupling the shift/latch to the power switches; and
   optical couplers coupling the power switches to the latch/shift.

6. The input/output power driver circuit board according to claim 5, wherein data to/from the latch is serial.

7. The input/output power driver circuit board according to claim 5, wherein data to/from the latch is parallel.

8. The input/output power driver circuit board according to claim 1, wherein each power driver switch module includes a shift/latch which has a read line, wherein said state controller can read the state of each power switch.

9. The input/output power driver circuit board according to claim 5, including a clear line to permit the shift/latch to be reset.

10. A high density input/output power driver circuit board, comprising:
    a circuit board having interface circuitry;
    a plurality of removably mounted input/output power driver switch modules mounted on said circuit board and interconnected with said interface circuitry;
    a bus interface for interfacing said circuit board with a computer; and
    a single state controller for setting the state of each power driver switch module in accordance with data received from said computer.

11. The input/output power driver circuit board according to claim 10, including an output set state memory for storing the set state of each power driver switch.

12. The input/output power driver circuit board according to claim 10, wherein the plurality of input/output modules are mounted at an angle to the circuit board to minimize the space required by the circuit board and mounted modules.

13. The input/output power driver circuit board according to claim 10, wherein each power switch module includes
    an output shift/latch;
    an input latch/shift;
    a plurality of power switches;
    optical couplers coupling the shift/latch to the power switches; and
    optical couplers coupling the power switches to the latch/shift.

14. The input/output power driver circuit board according to claim 13, wherein data input to the switch/latch is input serially.

15. The input/output power driver circuit board according to claim 13, wherein data input to the switch/latch is input in parallel.

16. The input/output power driver circuit board according to claim 10, wherein each power driver switch module includes a shift/latch which has a read line, wherein said state controller can read the state of each power switch.

17. The input/output power driver circuit board according to claim 13, including a clear line to permit the shift/latch to be reset.

* * * * *